United States Patent
Norsworthy

(10) Patent No.: US 7,525,455 B2
(45) Date of Patent: Apr. 28, 2009

(54) CODER APPARATUS FOR RESONANT POWER CONVERSION AND METHOD

(75) Inventor: Steven R. Norsworthy, Cardiff, CA (US)

(73) Assignee: STMicroelectronics N.V. (NL)

( * ) Notice: Subject to any disclaimer, the term of this patent is extended or adjusted under 35 U.S.C. 154(b) by 770 days.

(21) Appl. No.: 10/382,326

(22) Filed: Mar. 4, 2003

(65) Prior Publication Data

US 2003/0216906 A1    Nov. 20, 2003

Related U.S. Application Data

(60) Provisional application No. 60/361,813, filed on Mar. 4, 2002.

(51) Int. Cl.
*H03M 7/00* (2006.01)
(52) U.S. Cl. ......................... 341/50; 341/161
(58) Field of Classification Search ................ 341/143, 341/131, 144, 50, 161; 375/328
See application file for complete search history.

(56) References Cited

U.S. PATENT DOCUMENTS

| | | | |
|---|---|---|---|
| 3,711,725 A | 1/1973 | Johannessen | |
| 3,881,120 A | 4/1975 | Osterwalder | |
| 4,118,677 A | 10/1978 | Weldon | |
| 4,716,397 A * | 12/1987 | Werba et al. ................ | 341/160 |
| 4,996,495 A | 2/1991 | Birx | |
| 5,265,039 A * | 11/1993 | Curbelo et al. ............... | 356/319 |
| 5,305,004 A | 4/1994 | Fattaruso | |
| 5,353,309 A | 10/1994 | Agazzi et al. | |
| 5,446,729 A | 8/1995 | Jachowski | |
| 5,535,356 A * | 7/1996 | Kim et al. .................... | 711/103 |
| 5,701,106 A | 12/1997 | Pikkarainen et al. | |
| 5,729,230 A | 3/1998 | Jensen et al. | |
| 5,835,038 A * | 11/1998 | Nakao et al. ................ | 341/131 |
| 5,847,622 A | 12/1998 | Chen | |

(Continued)

FOREIGN PATENT DOCUMENTS

EP    0 895 359 A2    2/1999

(Continued)

OTHER PUBLICATIONS

Rex T. Baird et al., "Linearity Enhancement of Multibit ΔΣ A/D and D/A Converters Using Data Weighted Averaging", IEEE Transactions on Circuits and Systems II: Analog and Digital Signal Processing 42 Dec. 1995, No. 12, New York, US, pp. 753-762.

(Continued)

*Primary Examiner*—Rexford Barnie
*Assistant Examiner*—Joseph Lauture
(74) *Attorney, Agent, or Firm*—Lisa K. Jorgenson; William A. Munck

(57) ABSTRACT

An Nth-order shaping coder with multi-level quantization and dithered quantizer. The coder is inherently stable and produces a purely white quantization error spectrum. In one exemplary embodiment, the coder is first order, and an improved dither scheme is employed including applying a M-times (e.g., M=2) sample-and-hold to the dither sequence, effectively holding a constant dither for multiple clock cycles. This advantageously results in a reduction of instances where the quantizer jumps over two quantization intervals in one clock cycle without first passing through zero for one clock cycle. Methods for implementing the shaping coder are also disclosed.

13 Claims, 2 Drawing Sheets

U.S. PATENT DOCUMENTS

| | | | |
|---|---|---|---|
| 6,121,910 A * | 9/2000 | Khoury et al. | 341/143 |
| 6,181,199 B1 | 1/2001 | Camp, Jr. et al. | |
| 6,317,468 B1 | 11/2001 | Meyer | |
| 6,321,075 B1 | 11/2001 | Butterfield | |
| 6,462,685 B1 * | 10/2002 | Korkala | 341/131 |
| 6,522,277 B2 | 2/2003 | Fujimori et al. | |
| 6,587,060 B1 | 7/2003 | Abbey | |
| 6,624,531 B2 | 9/2003 | Disser et al. | |
| 6,658,239 B1 | 12/2003 | Elder et al. | |
| 6,664,913 B1 | 12/2003 | Craven et al. | |
| 6,697,003 B1 * | 2/2004 | Chen | 341/143 |
| 6,734,818 B2 * | 5/2004 | Galton | 341/161 |
| 6,825,784 B1 * | 11/2004 | Zhang | 341/131 |
| 6,839,389 B2 * | 1/2005 | Mehrnia et al. | 375/328 |
| 7,096,243 B2 * | 8/2006 | Van Der Valk et al. | 708/313 |
| 2001/0054974 A1 | 12/2001 | Wright | |
| 2002/0025006 A1 | 2/2002 | Mehrnia et al. | |

FOREIGN PATENT DOCUMENTS

| | | |
|---|---|---|
| JP | 6037829 | 2/1994 |
| JP | 9284168 | 10/1997 |
| JP | 11017759 | 1/1999 |
| JP | 2000183749 | 6/2000 |
| JP | 2000236361 | 8/2000 |
| JP | 2000316029 | 11/2000 |
| JP | 2001285960 | 10/2001 |
| JP | 2002057732 | 2/2002 |
| WO | WO9935746 | 7/1999 |
| WO | WO0038334 | 6/2000 |

OTHER PUBLICATIONS

IEEE Journal of Solid-State Circuits, vol. 33, No. 12, Dec. 1998, article entitled "An IC for Linearizing RF Power Amplifiers Using Envelope Elimination and Restoration" by David K. Su, Member IEEE, and William J. McFarland (7 pages).

2002 IEEE MTT-S Digest article entitled "Generation of RF Pulsewidth Modulated Microwave Signals Using Delta-Sigma Modulation by J. Keyzer, R. Uang, Y. Sugiyama", M. Iwamoto, I. Galton and P.M. Asbeck, University of California, San Diego, La Jolla, CA 92093-0407 (pp. 397-400).

2001 IEEE article entitled Digital Generation of RF Signals for Wireless Communications With Band-Pass Delta-Sigma Modulation by J. Keyzer, J. Hinrichs, A. Metzger, M. Iwamoto, I. Galton and P. Asbeck, University of California, San Diego, La Jolla, CA 92093-0407 (4 pages).

* cited by examiner

CODER APPARATUS FOR RESONANT POWER CONVERSION AND METHOD

PRIORITY

This application claims priority benefit of U.S. provisional patent application Ser. No. 60/361,813 entitled "CODER APPARATUS FOR RESONANT POWER CONVERSION AND METHOD" filed Mar. 4, 2002, which is incorporated by reference herein in its entirety.

RELATED APPLICATIONS

This application is related to co-owned and co-pending U.S. patent application Ser. No. 10/382,297 entitled "RESONANT POWER CONVERTER FOR RADIO FREQUENCY TRANSMISSION AND METHOD" filed contemporaneously herewith, which claims priority benefit of U.S. provisional patent application Ser. No. 60/361,812 of the same title filed Mar. 4, 2002, both of which are incorporated by reference herein in their entirety.

FIELD OF THE INVENTION

The present invention relates generally to signal processing, and specifically in one exemplary aspect to efficient apparatus and methods for signal modulation and noise-shaping encoding.

DESCRIPTION OF RELATED TECHNOLOGY

First-order modulators were the earliest types to be investigated, going back over roughly 50 years from the date of this filing. About 20 years ago, delta-sigma coders became feasible for commercial implementation. However, the industry largely abandoned first-order coders in favor of second- and higher-order coders, because first-order coders produce idle channel tones and correlated noise at intolerably high levels with respect to the required noise floor. All attempts at dithering out these unwanted tones to a purely white quantization error known to the Assignee hereof have failed to date. Also, first-order coders require significantly higher oversampling ratios to achieve the same in-band resolution as higher-order coders. These higher oversampling ratios are seen as a disadvantageous tradeoff by most circuit designers. In addition, modem VLSI technologies have virtually eliminated any penalty in additional complexity of implementation for higher-order coders. Hence, it is commonly and widely believed today that first-order coders have limited significant practical application in the industry.

Dithered Multibit ΔΣ Modulators

Dithering in PCM quantization is a mature art. As shown in FIG. 1, a PCM quantizer is dithered with an RPDF dither spanning one quantizer level, or a TPDF dither spanning two quantizer intervals. Dithered delta-sigma coders are documented by Norsworthy in Chapter 3 of *Delta-Sigma Data Converters*, IEEE Press, ISBN 0-7803-1045-4, incorporated herein by reference in its entirety.

The aforementioned reference clearly shows that for one-bit quantizers, the dither cannot span more than half the quantizer interval without excessively overloading the coder and causing instability. Even with this level of dither, lower-order modulators still exhibit idle channel tones and correlated noise. Nevertheless, one-bit coders are popular primarily because of following simple principle: two points define a straight line. Hence, they are inherently linear. However, there are many problems associated with them: they are inherently unstable for orders greater than two; their out-of-band noise density is relatively high, which is exacerbated at out-of-band frequencies through aggressive noise-shaping; they produce very large tones near $f_s/2$; there are problems implementing the out-of-band filters which follow them; they require relatively high oversampling rates, which may cause high power dissipation. An alternative is multi-bit noise-shaped coding. Various schemes have been reported to alleviate the strict matching requirements within the multi-bit D/A converter. As a result of bringing multi-bit capability into the design process, many parameters may be traded off and relaxed.

FIG. 1 illustrates a typical prior art pulse-code modulation (PCM) quantizer with dithering.

FIG. 2 illustrates a typical prior art noise-shaping coder with dithering.

Based on the foregoing, what is need is an improved apparatus for signal modulation for use in, inter alia, radio frequency or comparable communication systems which provides efficient implementation of coding and quantization.

SUMMARY OF THE INVENTION

In a first aspect of the invention, an improved apparatus for signal modulation is disclosed. The apparatus generally comprises a noise-shaping coder with multi-level quantization and a dithered quantizer. The apparatus advantageously is inherently stable and produces a purely "white" quantization error spectrum. In one exemplary embodiment, the apparatus comprises a no-overload stable first order noise-shaping coder with dithering and tri-level quantization. The apparatus advantageously is inherently stable and produces a purely "white" quantization error spectrum. In another exemplary embodiment, the apparatus comprises a no-overload stable first order noise-shaping coder with sample/hold decimation-by-M dithering and tri-level quantization.

In a second aspect of the invention, an improved method for implementing noise shaping coding is disclosed. The method generally comprises providing an input signal; and applying a multi-level quantization thereto, including applying an M-times sample-and-hold to the dither sequence, thereby effectively holding a constant dither for a plurality of clock cycles.

In a third aspect of the invention, an improved M-factor sample and hold decimation apparatus is disclosed. In one exemplary embodiment, the apparatus comprises a pseudo-random noise (PN) sequence generator having clocking at a rate M-times less than the coder's sampling clock rate.

BRIEF DESCRIPTION OF THE DRAWINGS

The features, objectives, and advantages of the invention will become more apparent from the detailed description set forth below when taken in conjunction with the drawings, wherein.

DETAILED DESCRIPTION OF THE INVENTION

Reference is now made to the drawings wherein like numerals refer to like parts throughout.

As used herein, the terms "transmit", "transmission" and "transmitting" for convenience may generally be considered to refer to both the acts of transmitting signals and receiving signals, as applicable.

As used herein the terms "memory" and "storage device" are meant to include any means for storing data or information, including, without limitation, RAM (e.g., SRAM, SDRAM, DRAM, SDRAM, EDR-DRAM, DDR), ROM (e.g., PROM, EPROM, EEPROM, UV-EPROM), magnetic bubble memory, optical memory, embedded flash memory, etc.

It will be recognized that while the following discussion is cast primarily in terms of a wireless RF handset (e.g., cellular telephones), the present invention is in no way limited to any particular wireless method, air interface, or architecture, or for that matter wireless applications. The invention may be applied with equal success to non-wireless systems of any kind as well, consistent with any limitations described herein.

Stability Test with Dither

One exemplary analysis of the general stability of multibit noise-shaping coders and modulators with dither is taken from the aforementioned reference by Norsworthy, Chapter 3, pp. 130-1. This stability test, based on the $L_1$-norm of the impulse response of the filter, makes the assumption that the quantizer must operate in the no-overload region in order to remain stable. For quantizers having a small number of bits, this assumption is sometimes too conservative, since many noise-shaping coder architectures operate with their internal quantizers outside of the no-overload region. Nevertheless, this type of stability analysis is still useful for examining the issues and trade-offs.

Figure 1:
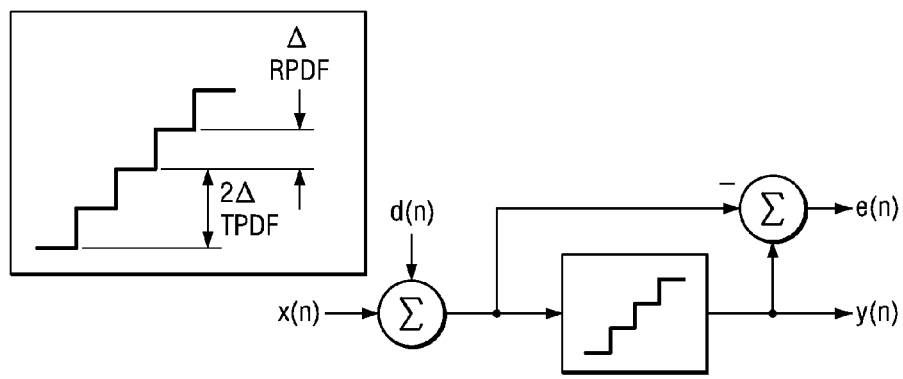
FIG. 1 is a functional block diagram illustrating the configuration of a typical prior art pulse-code modulation (PCM) quantizer with dithering.
Figure 2:
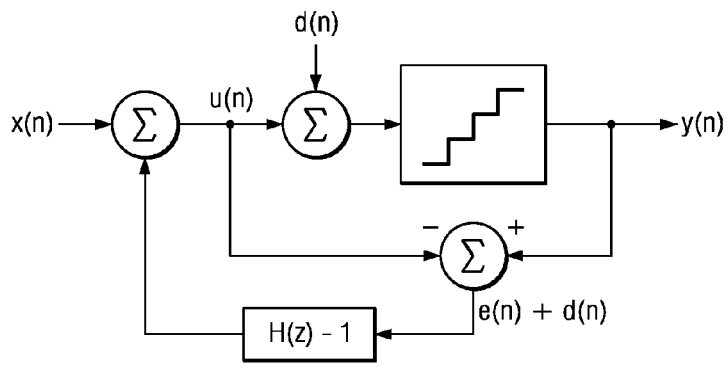
FIG. 2 is a functional block diagram illustrating the configuration of a typical prior art noise-shaping coder with dithering.

The signal variables in the following analysis apply to FIG. 1 and FIG. 2. As before, the quantization error occupies one quantization step interval $\Delta$. If the dither occupies a range of $\delta$, then the relative peak dither amplitude is $\delta/\Delta$. Therefore, $|e(n)| \leq \Delta/2$ and $|d(n)| = (\delta/\Delta)(\Delta/2)$, which leads to $$|u(n)| \leq |x(n)| + \left|\sum_{k=1}^{\infty} h(k)e(n-k)\right| + \left|\sum_{k=1}^{\infty} h(k)d(n-k)\right| \quad (1.1)$$

$$|u(n)| \leq \|x\|_\infty + \frac{\Delta}{2}\sum_{k=1}^{\infty} |h(k)| + \left(\frac{\delta}{\Delta}\right)\frac{\Delta}{2}\sum_{k=1}^{\infty} |h(k)|$$

$$|u(n)| \leq \|x\|_\infty + \frac{\Delta}{2}\left(1+\frac{\delta}{\Delta}\right)(\|h\|_1 - 1)$$

where $\|h\|_1$ is the $L_1$-norm of the scaled impulse given by $$\|h\|_1 \equiv \sum_{k=1}^{\infty} |h(k)| \quad (1.2)$$

and $\|x\|_\infty$ is the $L_\infty$-norm of the input, which is simply the maximum peak value $$|x|_\infty = |x|_{max}$$

For an L-level quantizer which is never overloaded, Eq. (1.1) becomes $$\frac{L}{L-1} \geq \|x\|_\infty + \frac{1}{L-1}\left(1+\frac{\delta}{\Delta}\right)(\|h\|_1 - 1) \quad (1.3)$$

so that $$\|h\|_1 \leq 1 + \frac{L-(L-1)\|x\|_\infty}{1+\delta/\Delta}$$

Re-arranging Eq. (1.3) for the convenience of specifying L, $$L \geq \frac{(1+\delta/\Delta)(\|h\|_1 - 1) - \|x\|_\infty}{1 - \|x\|_\infty} \quad (1.4)$$

Therefore, if the quantizer is to remain within the no-overload region, the quantizer must have enough dynamic range (steps) to contain a simultaneous occurrence of both the largest possible output value of the filter plus the largest input sample. Otherwise, the quantizer will overload, followed by potential loop instability. From Eq. (1.4), the penalty for added dither can readily be seen, but this penalty is actually rather modest. If the relative peak dither $\delta/\Delta$ is unity, the resulting value of L is exactly twice that of the un-dithered case, requiring one more bit of dynamic range in the quantizer.

Multi-Level Modulator with Dither

For the classic case where L=2, if $\delta/\Delta$ is unity, the quantizer will be fully dithered, but this would limit the no-overload input level to zero. By applying the relationship of Eq. (1.4) for the case where L=3, the no-overload input range is one-half of a quantization interval. Thus, while the useful input of the coder is reduced by half, and while a fully dithered quantizer doubles the noise error, the system produces a white noise error and is inherently stable at the same time.

When using the output of the coder to drive a power device (e.g., a cellular telephone handset), a tri-level quantizer is very important for saving power. First of all, if the system has equal probability of $\{+1, 0, -1\}$ occurrences, then one-third of the time the system is at rest, not having to deliver power at the output. However, much of this benefit will be lost with a traditional dither. The dither signal is ordinarily assumed to be a PN sequence that is relatively long with respect to the lowest frequency input signals into the modulator. It is also assumed to change values at every sampling clock interval. This results in clock-to-clock excursions at the output of the quantizer spanning as much as two quantization intervals. Hence, in the tri-level case with a fully dithered quantizer, there will be frequent occurrences where the quantizer output will jump from +1 to −1, or vice versa, without passing through zero first. Simulations performed by the Applicant herein show that by simply placing a sample-and-hold of a factor of two on the dither, i.e., by changing the dither samples only every other clock cycle, the result is a dramatic reduction (much more than a factor of two) in the number of occurrences where the quantizer steps through two quantization intervals in one clock cycle. This result is very important for power efficiency, because the wide excursions prevent the system from resting as often, and forces it to waste power at these intervals.

Figure 3:
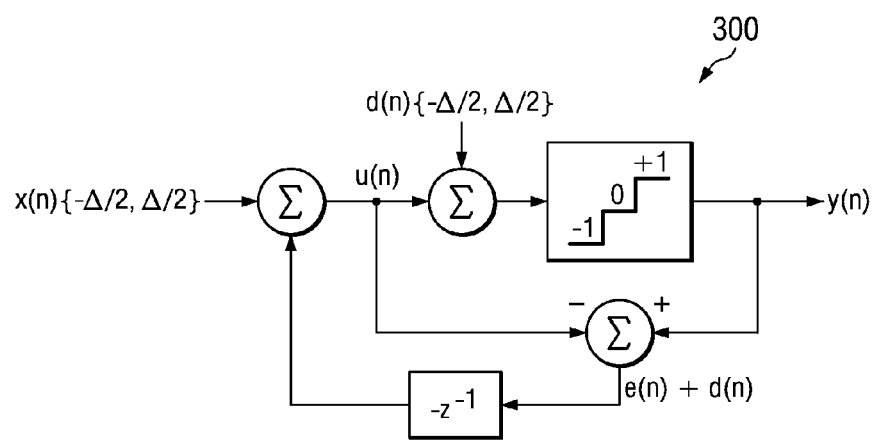
FIG. 3 is a functional block diagram illustrating an exemplary configuration of a no-overload stable first order noise-shaping coder with dithering and tri-level quantization according to the present invention.
Figure 4:
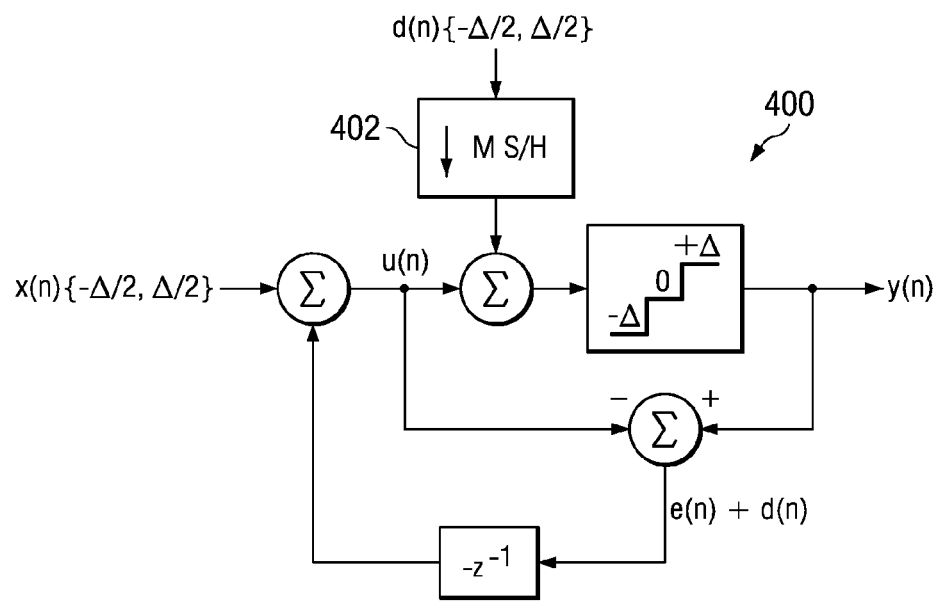
FIG. 4 is a functional block diagram illustrating an exemplary configuration of a no-overload stable first order noise-shaping coder with sample/hold decimation dithering and tri-level quantization according to the present invention.
Figure 5:
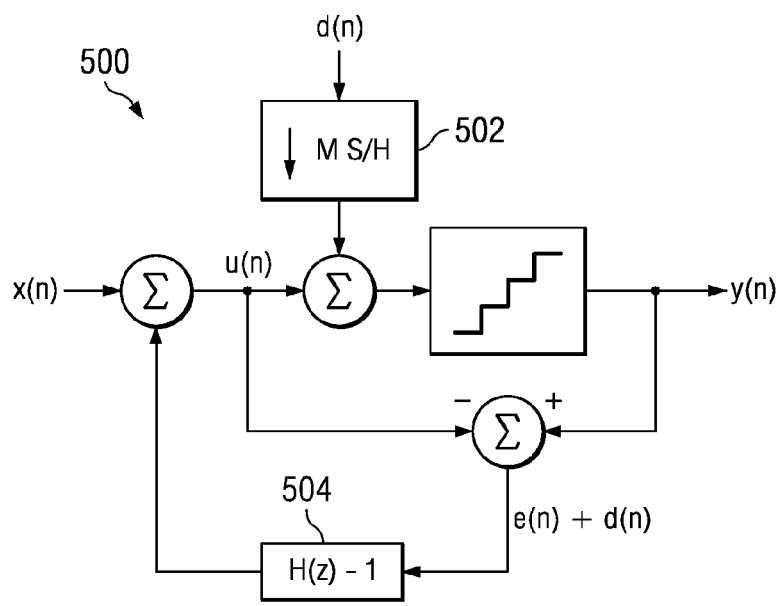
FIG. 5 is a functional block diagram illustrating an exemplary generalized configuration of a noise-shaping coder with sample/hold decimated dithering.

Referring now to FIGS. 3-5, various exemplary embodiments of the invention are described in greater detail. FIG. 3 is a functional block diagram illustrating an exemplary configuration of a no-overload stable first order noise-shaping coder 300 with dithering and tri-level quantization according to the present invention.

FIG. 4 is a functional block diagram illustrating an exemplary configuration of a no-overload stable first order noise-shaping coder 400 with sample/hold decimation dithering and tri-level quantization according to the present invention. An "M"-factor decimated sample-and-hold component 402 is utilized in this embodiment, with "M" comprising anything greater than one (1) to include, without limitation, powers of 2 (i.e., $2^1$, $2^2$, $2^3$, etc.) as well as other decimation factors not being a power of 2.

FIG. 5 is a functional block diagram illustrating an exemplary generalized configuration of a noise-shaping coder 500 with sample/hold decimated dithering according to the invention. Here, an M-factor decimation circuit 502 is utilized, in conjunction with any order (H(z)−1) coder 504, thereby illustrating the breadth of possible applications of the invention.

Prior art teaching on dithered noise-shaping coders, as can be found in the aforementioned text by Norsworthy et al., assumes that the sample rate of the dither is the same as the sample rate of the coder itself. By necessity to save power consumption, in the highest-frequency applications one typically looks for every opportunity to operate circuits at the lowest possible clock rates. The PN sequence generator that typifies the source of dither generation is usually composed of shift registers also clocking at a rate which is nearly the same as the sample rate of the coder itself. The Assignee hereof has discovered through extensive simulation that the dither can be nearly as effective if the dither samples are generated at a rate lower than the sampling rate of the coder. This is illustrated in the exemplary embodiments of FIGS. 4 and 5 described above. Specifically, the dither is shown going through a post-processing sample/hold decimation by a factor M.

In one exemplary implementation, this can be accomplished by simply running the clock of a PN sequence generator at a rate M times less than the coder's sampling clock rate. For example, if M=2, then one dither sample will effectively be held over two clock periods of the coder, or in other words, the coder's state variables may change twice as fast as the dither changes. In so doing, the power consumption of the PN sequence generation logic could be cut significantly. Even greater benefits may be derived overall if the PN register length is large. Typically the longer the PN code, the more random the dither, and the more effectively the coder is dithered. It will be recognized, however, that other approaches may be substituted for the foregoing PN-based decimation, such other approaches being readily implemented by those of ordinary skill given the present disclosure.

One particular exemplary application of the present invention is in conjunction with a resonant power converter such as that described in detail in Applicant's co-pending U.S. patent application Ser. No. 10/382,297 entitled "RESONANT POWER CONVERTER FOR RADIO FREQUENCY TRANSMISSION AND METHOD" filed contemporaneously herewith on Mar. 4, 2003, previously incorporated herein by reference in its entirety. It will be recognized, however, that myriad other uses of the present invention apart from the aforementioned resonant converter exist, and the present invention is no way limited to the aforementioned exemplary application(s).

For example, the exemplary first order encoder of FIG. 4 may be used in a time division multiple access (TDMA) system, or those akin to it such as GSM, landline modems, ADSL modems, digital audio coding (including voice band codecs), and potentially even time-modulated ultrawide bandwidth (TM-UWB) systems. TDMA and other such systems generally have less stringent out-of-band noise requirements, it may be possible to use first-order encoders. In systems such as TDMA, where the receiver and transmitter are not on at the same time, the suppression of quantization noise outside the transmit band of interest is not nearly as critical as in other systems in which both are on concurrently, such as CDMA, although it will be recognized that application of the present invention is not solely limited to those having receiver and transmitter not on at the same time.

It will also be readily appreciated that the dither scheme and apparatus described herein is equally applicable to any type of encoder, regardless of order (n=1, 2, 3, . . . ). For example, the invention may be applied to first-order encoders, second- or third-order encoders, etc.

It will also be recognized that while certain aspects of the invention are described in terms of a specific sequence of steps of a method or ordering of components in an apparatus adapted to implement the methodology of the invention, these descriptions are only illustrative of the broader invention, and may be modified as required by the particular application. Certain steps/components may be rendered unnecessary or optional under certain circumstances. Additionally, certain steps/components or functionality may be added to the disclosed embodiments, or the order of performance of two or more steps or components permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A digitally actuated resonant power (DARP) converter comprising:
   a dithered first order multi-level quantized noise-shaping encoder for receiving digital data at a clock rate Fc/L1, where L1 equals 2 or more and Fc is a carrier frequency, and encoding the digital data;
   a power supply, having a frequency at or substantially near DC;
   a resonator having a resonant frequency at or substantially near the carrier frequency Fc;
   a load impedance coupled to the resonator for receiving energy stored in the resonator; and
   a charging switch, the charging switch coupled to the first-order noise-shaping encoder, the power supply, the resonator, and a clock having a clock rate (L2)(Fc), where L2 equals 2 or more, the charging switch adapted to:
   (i) receive encoded data from said first-order noise-shaping encoder;

(ii) sample the voltage or current of said power supply; and (iii) deliver said power supply voltage or current samples to said resonator.

2. The converter in accordance with claim 1, further comprising:
a dither generator generating dither samples at a dither sample rate lower than a coder sample rate of the coder, wherein the dither samples are used for dithering during the quantization; and
wherein the coder is adapted to process an input signal containing the received digital data.

3. The coder in accordance with claim 2 wherein the dither sample rate is M times less than the coder sample rate, where M is greater than one.

4. The coder in accordance with claim 3 wherein M equals a power of 2.

5. The coder in accordance with claim 2 wherein the dither generator comprises a PN sequence generator.

6. The coder in accordance with claim 5 wherein the PN sequence generator operates at a clock rate equal to the coder sample rate divided by M, where M is greater than one.

7. The coder in accordance with claim 5 further comprising a sample/hold decimation apparatus that decimates the dither samples by M, where M is greater than one.

8. A method for implementing noise shaping coding for use in a digitally actuated resonant power (DARP) converter, comprising:
providing an input signal to a dithered first order multi-level quantized noise-shaping coder receiving digital data at a clock rate Fc/L1, where L1 equals 2 or more and Fc is a carrier frequency, and encoding the digital data;
providing power a power supply having a frequency at or substantially near DC from a power supply;
receiving energy stored in a resonator having a resonant frequency at or substantially near the carrier frequency Fc at a load impedance coupled to the resonator;
employing a charging switch, the charging switch coupled to the first-order noise-shaping coder, the power supply, the resonator, and a clock having a clock rate (L2)(Fc), where L2 equals 2 or more, to:
(i) receive encoded data from said first-order noise-shaping encoder;
(ii) sample the voltage or current of said power supply; and
(iii) deliver said power supply voltage or current samples to said resonator;
generating dither samples at a dither sample rate less than the coder sample rate;
dithering the input signal using the dither samples; and
applying multi-level quantization to the dithered input signal.

9. The method in accordance with claim 8 further comprising:
generating the dither samples at the dither sample rate that is M times less than the coder sample rate, where M is greater than one.

10. The method in accordance with claim 9 wherein M equals a power of 2.

11. The method in accordance with claim 8 further comprising:
generating the dither samples with a PN sequence generator.

12. The method in accordance with claim 11 further comprising:
operating the PN sequence generator at a clock rate equal to the coder sample rate divided by M, where M is greater than one.

13. The method in accordance with claim 11 further comprising:
sampling and holding the PN sequence dither samples by a factor M, where M is greater than one.

* * * * *